(12) United States Patent  
Hamano et al.

(10) Patent No.: US 6,650,674 B1
(45) Date of Patent: Nov. 18, 2003

(54) PHOTOELECTRIC CONVERTER FOR WIRELESS COMMUNICATION

(75) Inventors: Toshihisa Hamano, Nakai-machi (JP); Shigeo Kawasaki, Hiratsuka (JP)

(73) Assignees: Fuji Xerox Co., Ltd., Tokyo (JP); Tokai University, Tokyo (JP)

(*) Notice: Subject to any disclaimer, the term of this patent is extended or adjusted under 35 U.S.C. 154(b) by 186 days.

(21) Appl. No.: 09/625,415

(22) Filed: Jul. 25, 2000

(30) Foreign Application Priority Data

Jul. 26, 1999 (JP) .......................................... 11-211312

(51) Int. Cl.$^7$ ................................................. H01S 5/00

(52) U.S. Cl. ......................................................... 372/50

(58) Field of Search ..................................... 372/50, 96

(56) References Cited

U.S. PATENT DOCUMENTS

| | | | | | |
|---|---|---|---|---|---|
| 4,521,888 | A | * | 6/1985 | Hayashi et al. | 372/50 |
| 5,283,447 | A | * | 2/1994 | Olbright et al. | 372/50 |
| 5,796,714 | A | * | 8/1998 | Chino et al. | 372/50 |
| 6,026,108 | A | * | 2/2000 | Lim et al. | 372/50 |

OTHER PUBLICATIONS

Matsuo et al, "Monolithically Integrated Photonic Switching Device Using an MSM PD, MESFET's, and a VCSEL", IEEE Photonics Technology Letters, vol. 7, No. 10, Oct. 1995, pp. 1165–1167.*

Hayeiwa et al., *TV Wave Receiving System Using Optical Modulator*, The Insititute of Electronics, Information and Communication Engineers, C–I, vol. J79–C–I, No. 7, pp. 249–255 (Jul. 1996).

Nishikawa et al., *Millimeter–Wave Photonic Passive Base Station Employing the Nonlinear Photodetection Scheme*, The Institute of Electronics, Information and Communication Engineers, Microwave Photonics Workshop 1997–18, pp. 52–58, (1998). (no month).

Izutsu, *Microwave Photonics: New Direction between Microwave and Photonic Technologies*, Communications Research Laboratory, Ministry of Posts and Telecommunications, C–I, vol. J81–C–I, No. 2, pp.47–54, (Feb. 1998).

Izutsu et al., *Tuning Properties of Microwave–Lightwave Mixing by MESFETs*, Integration Technology of Microwaves and Lightwaves–Systems and Devices, (Sep. 1996).

Wake et al., *Passive picocell: a new concept in wireless network infrastructure*, Electronic Letters, vol. 33, No. 5, pp. 404–406 (Feb. 1997).

Smith et al., *Full–Duplex Fiber–Wireless System Using Electrical and Optical SSB Modulation For Efficient Broadband Millimeter–Wave Transport*, Proc. Microwave Photonics Workshop 1997, Duisburg, FR 2–2, pp. 223–226, (1997). (no month).

(List continued on next page.)

*Primary Examiner*—Quyen Leung
(74) *Attorney, Agent, or Firm*—Oliff & Berridge, PLC

(57) ABSTRACT

The present invention is made to provide a photoelectric converter for wireless communication that functions as the center of a base station for providing a base station which is simple, can be manufactured at low cost and meets sufficient performance in a high frequency band. Therefore, a photoelectric converter for wireless communication according to the invention is provided with an n-type DBR mirror layer as a first mirror, an active layer area and a p-type DBR mirror layer as a second mirror composing a cavity together with the n-type DBR mirror layer respectively sequentially laminated on an n-type substrate, VCSEL in which an electrode on the side of p and an electrode on the side of n are provided, a channel that transmits light laminated on VCSEL and MESFET composed of a gate electrode as a mirror electrode composing a cavity together with the n-type DBR mirror layer of VCSEL, a source electrode and a drain electrode.

21 Claims, 9 Drawing Sheets

OTHER PUBLICATIONS

Shiomi et al., *Optical Pulse Modulation of HMIC Oscillator used Illuminated MESFET*, The Institute of Electronics, Information and Communication Engineers, SC–3–3, p. 367, (1996). (no month).

Nishikawa et al., *Millimeter–Wave Photonic Passive Base Station Employing the Nonlinear Photdetection Scheme*, The Institute of Electronics, Information and Communication Engineers, MWP97–18, pp. 52–58, (1998). (no month).

* cited by examiner

PHOTOELECTRIC CONVERTER FOR WIRELESS COMMUNICATION

BACKGROUND OF THE INVENTION

1. Field of the Invention

The present invention relates to a photoelectric converter for wireless communication, more particularly relates to a photoelectric converter for wireless communication that converts a signal transmitted via an optical fiber to a microwave signal or receives a microwave signal conversely transmitted from terminal equipment and converts it to a signal for transmitting to an optical fiber in a field of wireless communication utilizing microwave photonics.

2. Description of the Related Art

For the embodiment of a concept that a microwave or a submillimeter wave is transmitted via an optical fiber, a remote antenna used in a community antenna television (CATV) system has been widely known and is currently in practical use. Actually, a system that a broadcast signal received via a (passive) antenna installed on a mountain apart by a few km is transmitted to a village at the foot via an optical fiber and television is watched there is implemented and for example, Kazuhisa Haeiwa et al. propose a TV wave receiving system shown in FIG. 8 on pp. 249 to 255 of "TV Wave Receiving System Using Optical Modulator" in a collection C-I, J79-C-I, 7 published in 1996 by the Institute of Electronics, Information and Communication Engineers.

In the meantime, recently, demand for mass wireless communication (for example, approximately 155 Mbps), compared with the quantity of wireless communication so far is increasing and particularly, application that a microwave and a millimeter wave with a high frequency band of approximately 10 and a few GHz to a few tens GHz including so-called microwave and millimeter wave which can still handle the problem of the exhaustion of a frequency due to a mobile telephone as a base band are transmitted via an optical fiber and application to LAN for example are also desired. However, a high-frequency electric signal such as a microwave and a millimeter wave is greatly attenuated when it is transmitted in air. Therefore, for application to LAN, a base station is required to be provided in each room in a building and picocell communication is required to be executed.

For such wireless communication, there is two-way communication including a downlink where a lightwave in which a signal is superimposed is transmitted from a central station to a base station, is converted to an electric signal at the base station and the converted electric signal is transmitted from an antenna of the base station to a terminal station and an uplink where an electric signal (a radio wave) transmitted from a terminal station is converted to an optical signal at a base station and is transmitted to a central station.

As the number of base stations becomes enormous for picocell communication for implementing a high frequency in future, a base station as simple as possible is desired.

For a simple base station, Kenzo Nishikawa et al. report the configuration of a base station employing a nonlinear photodetection scheme of a photodiode on pp. 52 to 58 of "Millimeter-Wave Photonic Passive Base Station Employing the Nonlinear Photodetection Scheme" published in Second Microwave Photonics Workshop (MPW97) of Shingakugiho, however, only a downlink is currently implemented and if this scheme can be applied to an uplink in future, actual use will be enabled. Also, as described in M. Izutsu et al., "Turning properties of microwave-light wave mixing by MESFETs", Tech. Digest of URSI96, Lille, September 1996, for a downlink, the conversion of optical signal to a radio wave using a photodiode (PD) and a three-terminal element such as MESFET and HEMT is possible to some extent. The problem has been in how simple a system an uplink can be configured.

Also, in D. Wake et al., Passive picocell: a new concept in wireless network infrastructure", Electronics Letters, Vol.33, No.5, pp. 404 to 406, 1997, a two-way communication system using an electron absorption modulator (EAM) shown in FIG. 9 is proposed as a system implementable in a part of a microwave band. However, signal strength is still weak and for a complete passive type, it is difficult to apply the system except a picocell of approximately 6 m at 3 Mbps. For practical use, technical breakthrough for a high frequency for the enhancement of sensitivity and speedup is required. Also, in an example of the electron absorption modulator, a light source is installed on the side of a central station and light transmitted from the central station is used, however, in this case, application to LAN in a building having plural base stations requires complicated control over light and others, which is a problem in practical use. In addition, an EAM is very expensive.

Further, in G. H. Smith et al., "Full-duplex fiber-wireless system using electrical and optical SSB modulation for efficient broadband millimeter-wave transport", Proc.MWP97, Duisburg, pp. 223 to 226, 1997, a report is described that a down stream of 155 Mbps and an up stream of approximately 50 Mbps are possible using a millimeter wave band of 38 GHz, though it is currently at a testing stage. However, the proposed system is a very large-scale system, and the installation of a base station in each room in a building and operation based upon a picocell cannot be implemented.

As described above, heretofore, for an example that two-way communication is implemented by one element, there is only an example that the electron absorption modulator shown in FIG. 9 is used for a base station. In the meantime, for a downlink, there are various reports of an element which can include a simple base station, however, the configuration of a simple base station for enabling an uplink is currently hardly implemented. Therefore, the development of a base station using as simple an element as possible to which up to a few tens GHz band which is a so-called (quasi-)millimeter wave band can be applied has been desired.

SUMMARY OF THE INVENTION

The present invention provides a photoelectric converter for wireless communication that functions as the center of a base station for providing a base station which is simple, can be manufactured at low cost and meets sufficient performance in a high frequency band. Also, the invention provides a photoelectric converter for wireless communication which can have a base station for two-way communication including an uplink and a downlink by one element.

The photoelectric converter for wireless communication according to the invention includes a laser having a first resonance mirror and a second resonance mirror, a third mirror into which a laser beam emitted from the laser enters, a channel provided between the third mirror and the laser, through which the laser beam emitted from the laser is transmitted, and plural electrodes that supply electrical energy to the channel.

Also, according to another aspect of the present invention, the photoelectric converter includes a laser having a first resonation mirror and a second resonation mirror, a mirror electrode into which a laser beam emitted from the laser enters, a channel provided between the mirror electrode and the laser, through which the laser beam emitted from the laser is transmitted, and plural electrodes, including the mirror electrode, that supply electrical energy to the channel.

In the case where the photoelectric converter for wireless communication according to the invention is used for an element for an uplink, a depletion layer in the channel varies in thickness according to the electrical energy supplied by at least one of the plural electrodes and the incident laser beam is modulated. In the case where the third mirror is a mirror electrode, the depletion layer in the channel varies in thickness according to the electrical energy supplied by the mirror electrode and the incident laser beam is modulated.

In the meantime, in the case where the photoelectric converter for wireless communication is used for an element for a downlink, a photocarrier is generated according to a signal entered into the channel together with the laser beam, and the electrical energy supplied by at least one of the electrodes is modulated.

Also, according to another aspect of the present invention, the photoelectric converter for wireless communication includes a vertical cavity surface emitting laser having a first mirror and a second mirrors, a mirror electrode constituting a cavity together with a vertical cavity of the vertical cavity surface emitting laser and provided in the cavity, a channel provided between the mirror electrode and the vertical cavity surface emitting laser, through which a laser beam emitted from the laser is transmitted, and plural electrodes, including the mirror electrode that supply electrical energy to the channel.

BRIEF DESCRIPTION OF THE DRAWINGS

A preferred embodiment of the invention will be described in detail based upon the followings, wherein.

DETAILED DESCRIPTION OF THE PREFERRED EMBODIMENT

The invention will be described in detail below based upon a concrete embodiment.

First, a communication system to which a photoelectric converter for wireless communication according to the invention is applied will be described.

Figure 2:
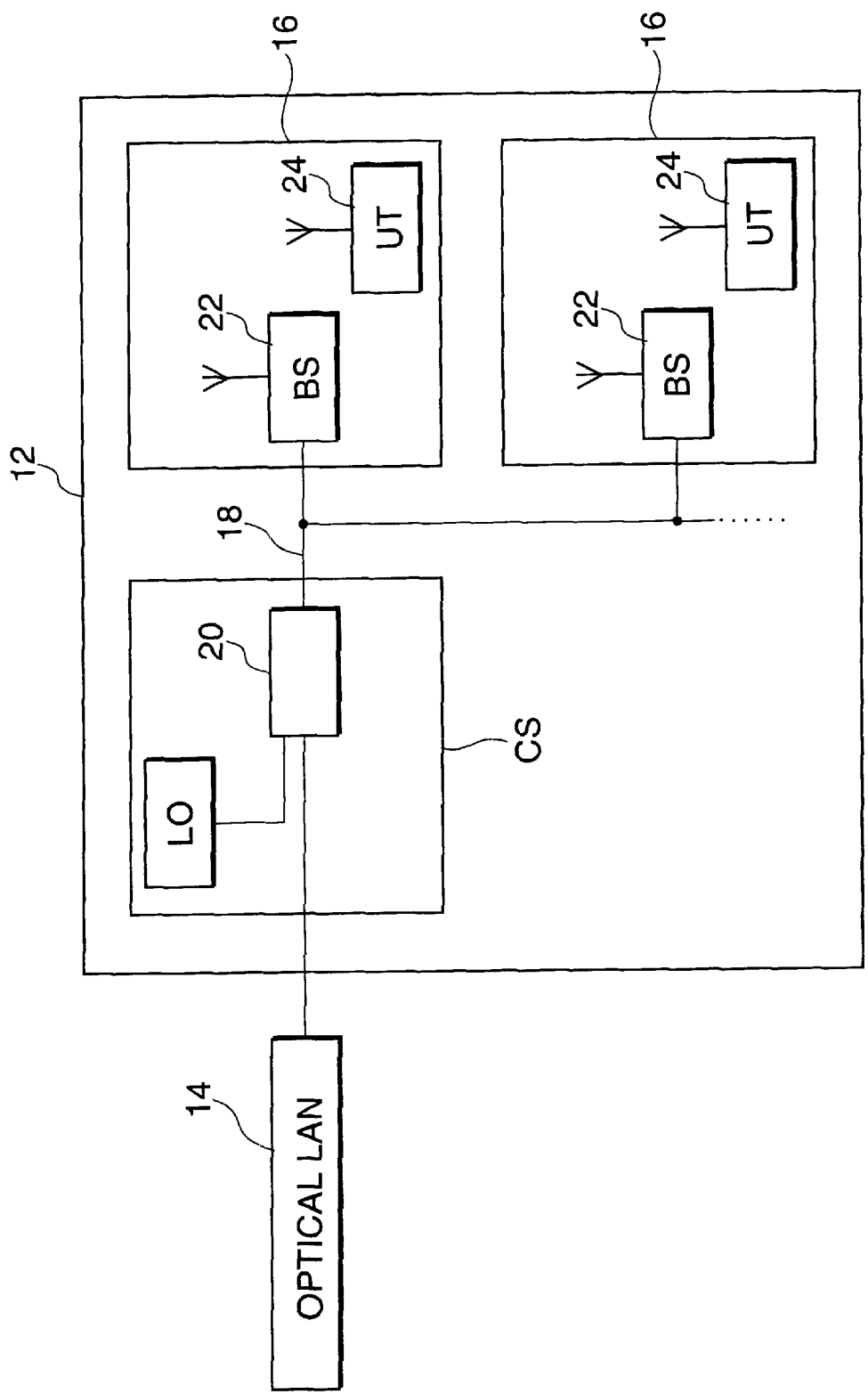
FIG. 2 is a schematic sectional view showing a photoelectric converter for wireless communication of an embodiment of the invention.

The communication system includes a central station CS provided inside a building 12 and connected to an external optical LAN 14, a base station BS provided on the ceiling of each room 16 in the building 12 and connected to the central station CS via an optical fiber 18 and a user terminal UT installed in each room 16 as shown in FIG. 2. The central station CS and plural base stations BS can also be connected by using a branching filter. For simplification, a router for optical LAN normally used and others are not shown. In case a base station BS is provided on a ceiling in such a communication system, power can be supplied from a power line wired on the ceiling and power supply is never disconnected.

The central station CS includes an optical local oscillator LO and a coupler 20. The base station BS includes a circuit for an uplink and a circuit for a downlink and a photoelectric converter having the same configuration is provided to each circuit. Also, antennas 22 and 24 respectively for transmission and receiving are provided to the base station BS and the user terminal UT.

The photoelectric converter according to the invention is characterized in that it can include the base station BS in the communication system described above, has a light source such as a laser light source inside and the interaction of light and a radio wave is generated inside.

Figure 1:
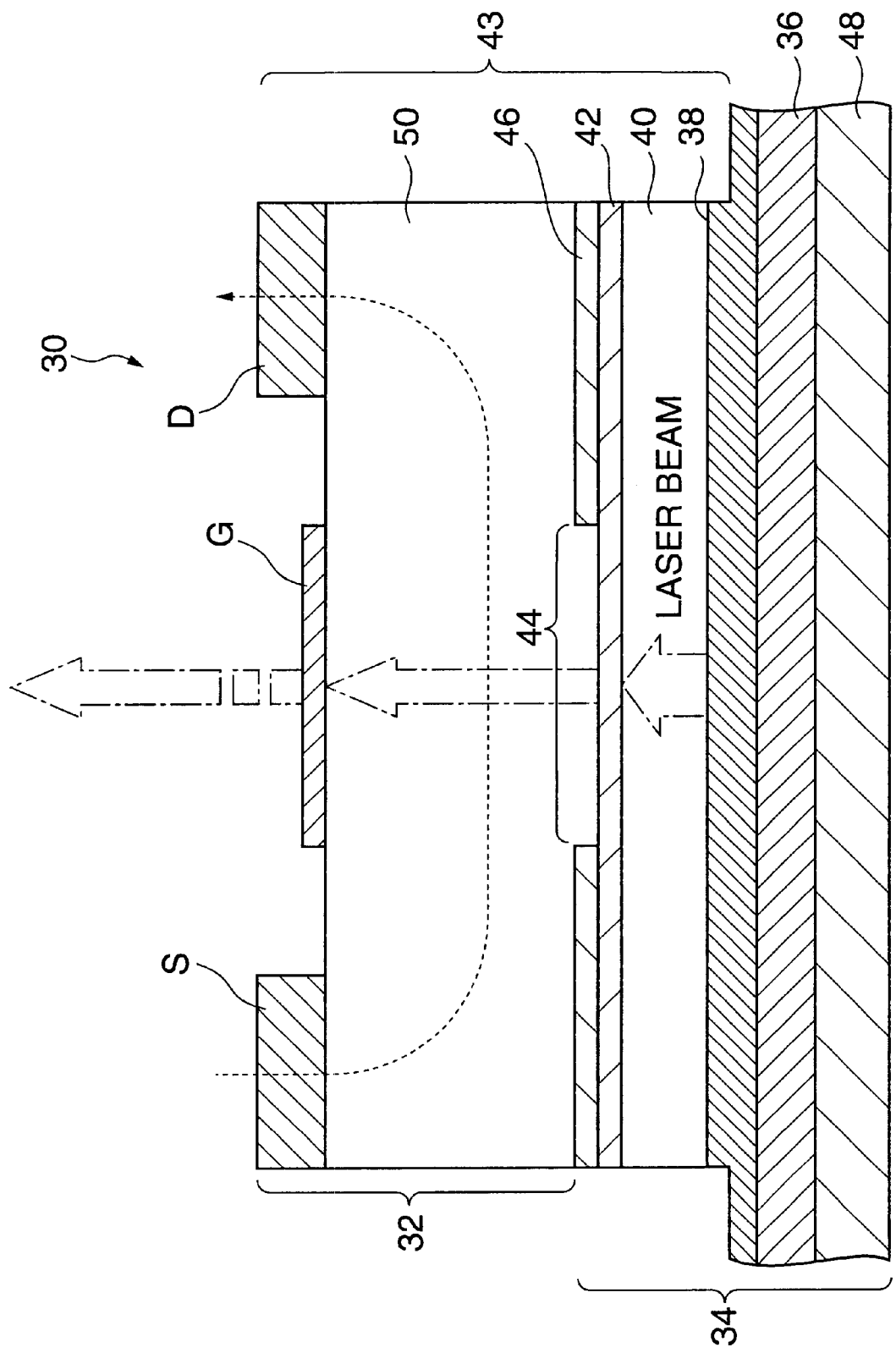
FIG. 1 is a schematic drawing showing a communication system to which a photoelectric converter for wireless communication according to the invention is applied.

A photoelectric converter 30 is produced by integrating a vertical cavity surface emitting laser (VCSEL) which is a laser beam source in addition to a metal semiconductor field effect transistor (MESFET) which is a three-terminal element as shown in FIG. 1 and includes MESFET 32 and VCSEL 34.

An n-type DBR mirror layer 38 as a first mirror, an active layer area 40 including a multiple quantum well active layer (MQW) and a p-type DBR mirror layer 42 as a second mirror are sequentially laminated on an n-type substrate 36 of VCSEL 34 by epitaxial growth, the n-type DBR mirror layer 38 is etched halfway and a semiconductor post in the shape of a cylinder or a prism approximately 40 $\mu$m in diameter is formed. An electrode 46 on the side of p is provided except a central outgoing area 44 in the upper part of the post and an electrode 48 on the side of n is provided on the back of the substrate 36. A laser cavity includes the n-type DBR mirror layer 38 and the p-type DBR mirror layer 42.

A channel 50 of MESFET 32 approximately a few $\mu$m thick is laminated by epitaxial growth in the upper part of the post where the electrode 46 on the side of p is provided and forms the post 43. Three types of electrodes, namely, a source electrode S, a drain electrode D and a gate electrode G as a mirror electrode of which the reflecting surface is formed on the side of the channel 50 are segmentally formed on the channel 50 and the gate electrode G of the three electrodes constitutes a cavity as a third mirror together with the n-type DBR mirror layer 38 of VCSEL 34.

For VCSEL 34, VCSEL for red using InGaP or AlGaInP can also be used in addition to VCSEL for near infrared radiation using AlGaAs, GaAs or InGaAs for an active layer. VCSEL for blue or ultraviolet radiation using GaN or ZnSe and VCSEL for a 1.3 to 1.5 $\mu$m band using InGaAsP can also be used.

However, in any case, MESFET 32 has a construction such that the laser beam emitted from VCSEL 34 is scattered by the channel 50 and leaked from between the gate electrode G and the source electrode S or between the gate electrode G and the drain electrode D, or that the laser beam is directly transmitted through the gate electrode G. In the case where VCSEL for near infrared radiation using AlGaAs for an active layer is used, material made of InP is used for the channel 50 of MESFET 32.

Figure 3:
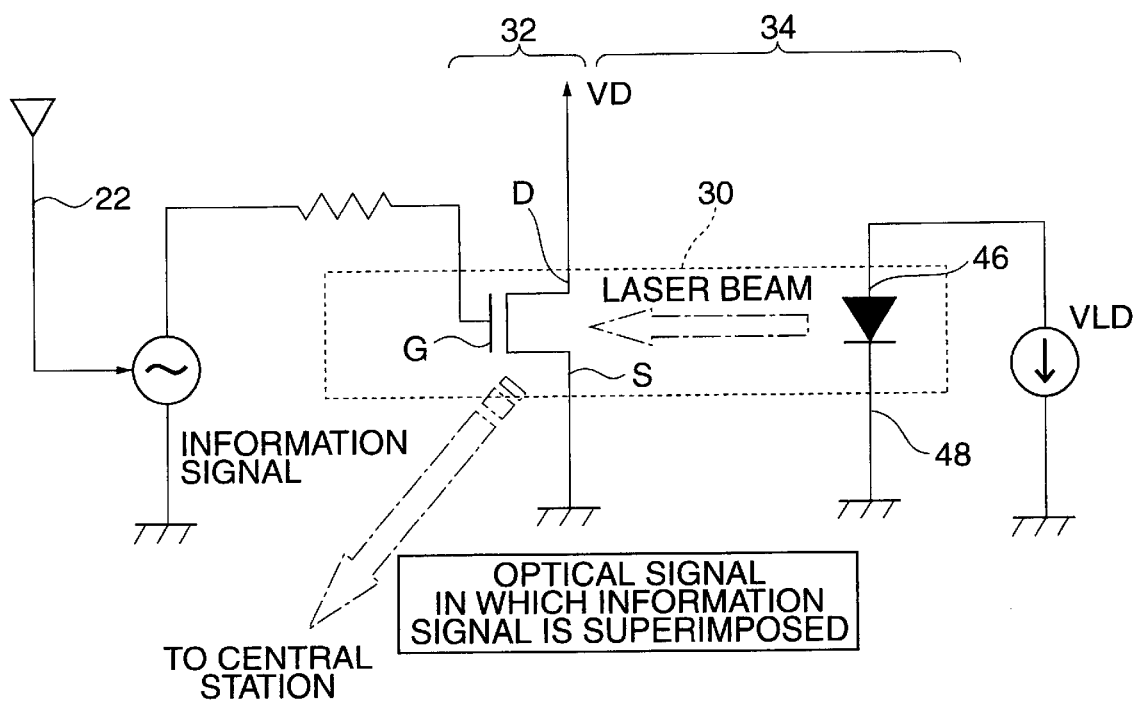
FIG. 3 is an equivalent circuit diagram in the case where the photoelectric converter according to the invention is used for a photoelectric converter for an uplink.

FIG. 3 shows an equivalent circuit in the case where the photoelectric converter according to the invention is used for a photoelectric converter for an uplink. The gate electrode G of the photoelectric converter 30 is directly or indirectly connected to an antenna 22, the drain electrode D of MESFET 32 is connected to a power source VD, the electrode 46 on the side of p of VCSEL 34 is connected to a power source VLD, and the source electrode S of MESFET 32 and the electrode 48 on the side of n of VCSEL 32 are grounded.

In the case of an uplink, a millimeter wave on which an electric signal transmitted via the antenna 24 provided to the user terminal UT is superimposed is received via the antenna 22 provided to the base station BS as shown in FIGS. 2 and 3, the electric signal is converted to an optical signal by causing interaction between the received electric signal and a laser beam emitted from a power source in the photoelectric converter 30 in the photoelectric converter 30 provided to the base station BS and the optical signal is transmitted toward the central station CS via the optical fiber 18 connecting the base station BS with the central station CS.

Figure 4:
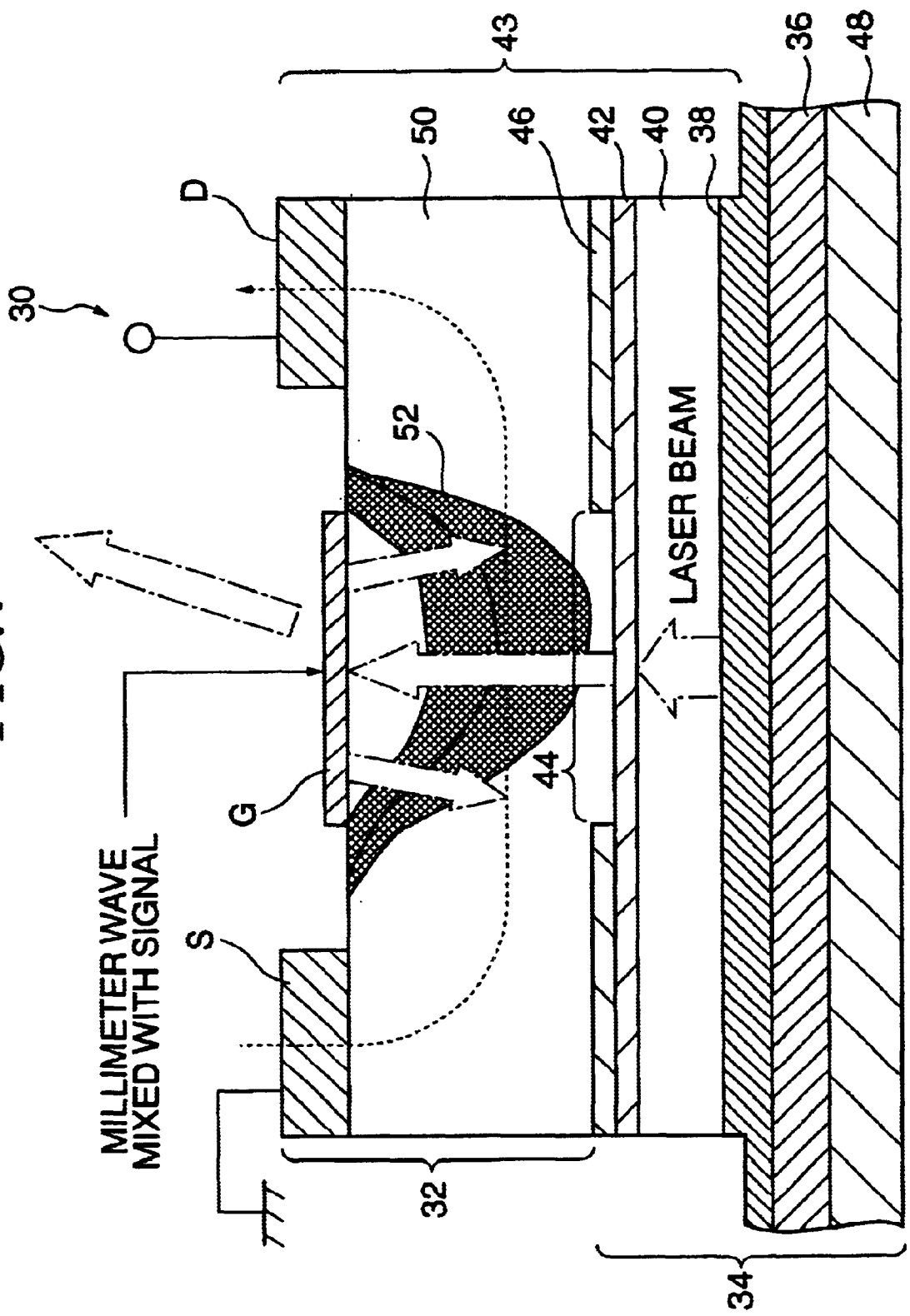
FIG. 4 is a schematic sectional view showing the variation in thickness of a depletion layer in the case where an uplink signal is input to the photoelectric converter according to the invention.

At this time, in the photoelectric converter 30, as shown in FIG. 4, the millimeter wave on which the electric signal is superimposed is input to the gate electrode G of MESFET 32 via the antenna 22. When a laser beam in a 1.5 Fm band for example is applied from VCSEL 34 to the gate electrode G, the laser beam repeats multiple reflection between the n-type DBR mirror 38 of VCSEL 34 and the gate electrode G and when the laser beam has intensity exceeding predetermined intensity, it is transmitted in the gate electrode G and is output to an external device. However, in the meantime, a depletion layer area 52 under the gate electrode G expands or contracts according to the power of the electric signal input to the gate electrode G, the absorption coefficient of semiconductor in the channel area 50 of MESFET 32 changes, the change varies the intensity of light incident on the channel area 50 and as a result, the intensity of output light varies. This principle is similar to a phenomenon modulated when light is incident on PD of which the gate is modulated. As described above, the laser beam of which the intensity is modulated by the electric signal superimposed on a millimeter wave received via the antenna 22 is transmitted in the gate electrode G which is a mirror electrode including a cavity, is emitted, is input to the optical fiber 18 and is transmitted to the central station CS via the optical fiber 18.

Figure 5:
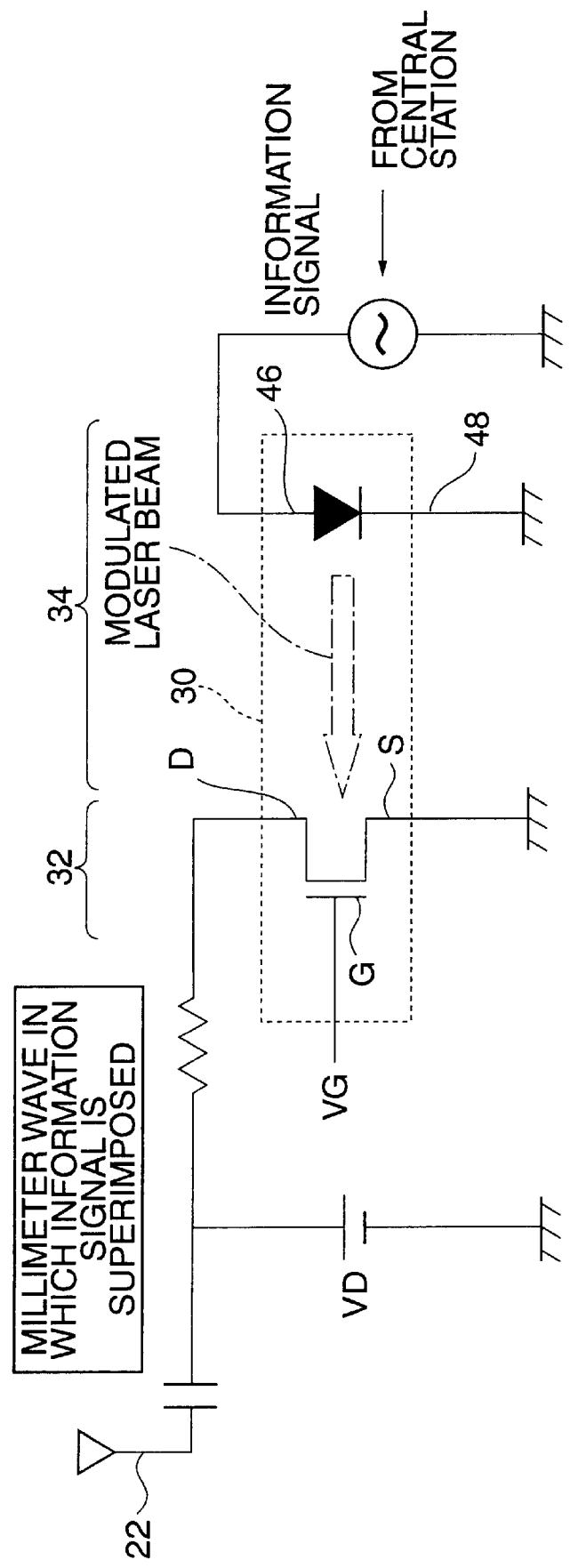
FIG. 5 is an equivalent circuit diagram in the case where the photoelectric converter according to the invention is used for a photoelectric converter for a downlink.

FIG. 5 shows an example of an equivalent circuit in the case where the photoelectric converter according to the invention is directly modulated and is used for the photoelectric converter for a downlink. The drain electrode D of the photoelectric converter 30 is directly or indirectly via a resistor and a capacitor connected to the antenna 22 and the power source VD, and the gate electrode G of MESFET 32 is connected to a power source VG. In the case where VCSEL 34 is directly modulated, an electric signal (an information signal) from the central station CS is input to the electrode 46 on the side of p of VCSEL 34. The source electrode S of MESFET 32 and the electrode 48 on the side of n of VCSEL 34 are grounded.

In the case where a downlink is with the fiber link of the conventional arts, as shown in FIG. 2, when a signal (an IF signal) is input from external optical LAN 14 connected to the central station CS to the central station CS, the signal and a millimeter wave input from an optical local oscillator LO are mixed by a coupler 20 provided to the central station CS and light (modulated light) on which the signal is superimposed is transmitted from the central station CS to the base station BS via the optical fiber 18 connecting the base station BS with the central station CS. At the base station BS, a photocarrier is generated by applying light transmitted via the optical fiber on the channel of MESFET, source-drain current of MESFET is modulated by the photocarrier and the signal is converted to an electric signal. Unlike the case shown in FIG. 2, after sending the IF signal from the central station CS to the base station BS without mixing the IF signal and the millimeter wave, the electric signal may also be input using VCSEL to the electrode 46 on the side of p of VCSEL 34 and directly modulated as shown in FIG. 5.

When modulated light thus enters into the gate electrode G, and further to the channel 50 of MESFET 32, it is resonated between the n-type DBR mirror 38 of VCSEL 34 and the gate electrode G. Fixed voltage is respectively applied to the gate electrode G and the source electrode S of MESFET 32, modulation by reactance under the gate of MESFET is caused by a photocarrier generated in the channel and varied by the application of the modulated light, an optical signal is converted to an electric signal and is transmitted to the user terminal UT via the antenna 22 of the base station BS. The user terminal UT receives the transmitted electric signal via the antenna 24 provided to the user terminal UT.

A downlink system using a three-terminal element is described on p. 367 of "Optical Pulse Modulation by HMIC Oscillator Using Beam Emission MESFET" written by Shiomi et al. and published in 1996 at the Institute of Electronics Information and Communication Engineers Electronics Society General Meeting SC-3-3.

In the above embodiment, MESFET is used for a three-terminal element, however, a high electron mobility transistor (HEMT) and a heterobipolar transistor (HBT) may also be used in place of MESFET. In this case also, in the case of an uplink, the electric signal from the user terminal UT has only to be applied to a gate (a base).

Also, VCSEL is used for a laser beam source, however, if the laser beam source is a light source that emits a laser beam from a laser cavity provided with a first mirror and a second mirror, there is no particular limitation and an end face emission-type laser can also be used.

In this embodiment, MESFET is integrated on VCSEL by epitaxial growth, however, MESFET and VCSEL may also be integrated by bonding both after they are separately produced.

In this embodiment, the gate electrode of MESFET is used for a third mirror, however, the electrode and the third mirror may also be separately provided.

Figure 6A:
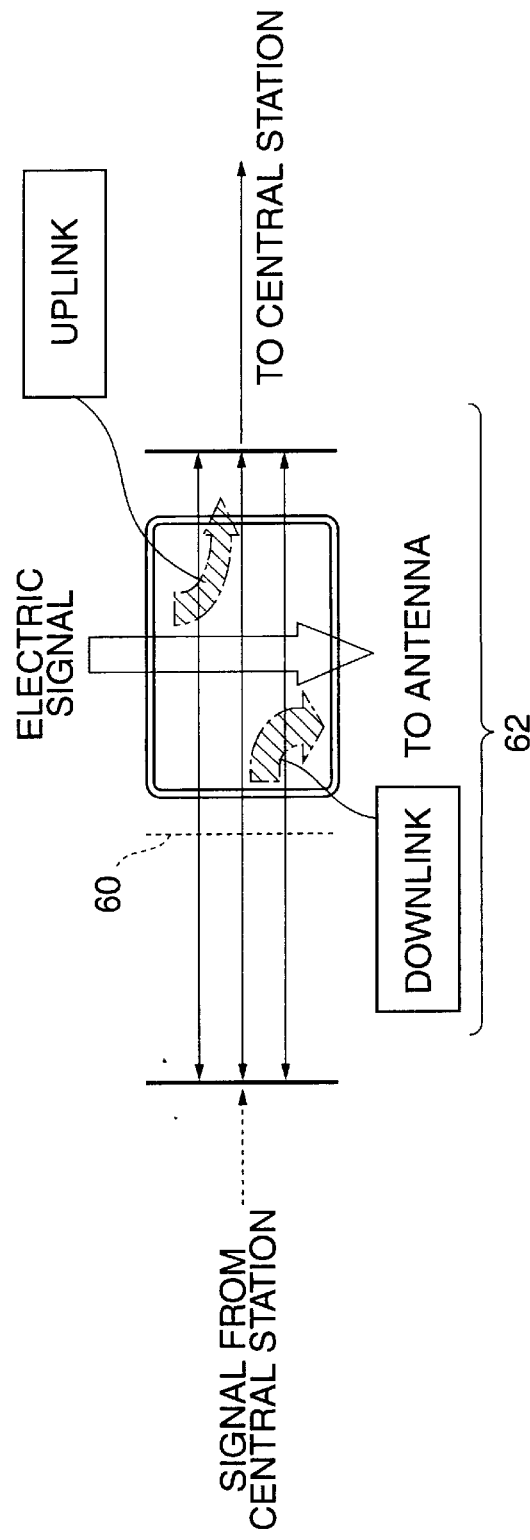
FIG. 6A shows a configuration in which a third mirror is arranged inside a laser cavity and FIG. 6B shows a configuration in which the third mirror is arranged outside the laser cavity.
Figure 6B:
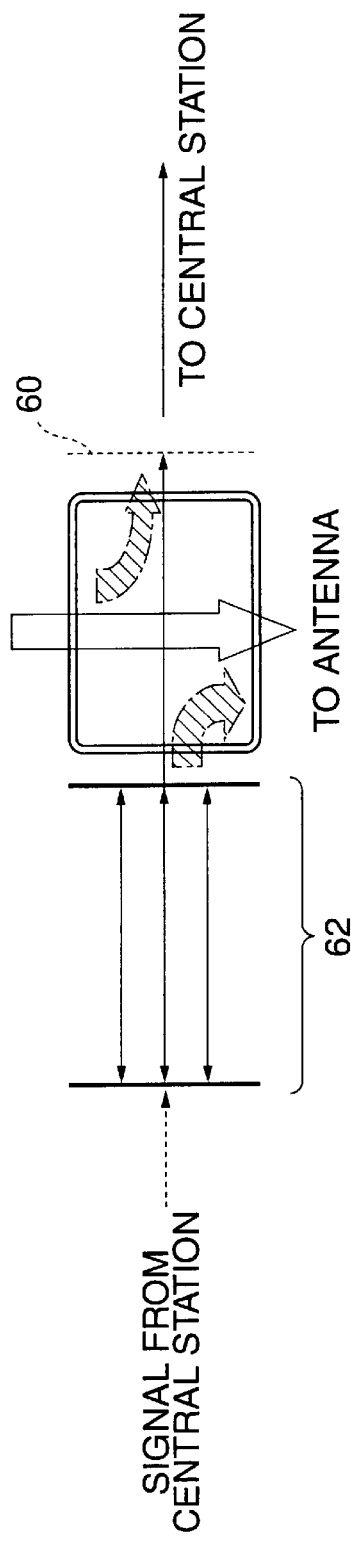

In this embodiment, as shown in FIG. 6B, a third mirror 60 is arranged outside a cavity 62 of a laser, however, as shown in FIG. 6A, the third mirror 60 can also be arranged inside the laser cavity 62. As the length of the cavity of the laser is short in the case where it is arranged inside, it is not easy to provide the third mirror there, various measures such as change of an optical path are required and it is considered that there are many limitations when the device is actually manufactured, however, it is theoretically possible that the third mirror is arranged inside the cavity.

Also, a method of driving the photoelectric converter is not limited by the above embodiment. For example, in the above embodiment, in the case of an uplink, an electric signal is input to the gate electrode and source-drain current is also naturally modulated though source-drain current is not particularly referred. Also, the case that the electric signal from the antenna is input to only the gate is shown, however, as the thickness of a depletion layer is also varied by drain voltage, a more effective result of modulation can be acquired by inputting the electric signal from the antenna to the side of the drain or both sides of the drain and the gate. Furthermore, the change of a depletion layer is increased by variously controlling the shape of the lower part of a channel in FET as V-groove FET and multichannel FET and light may also be further modulated.

Figure 7:
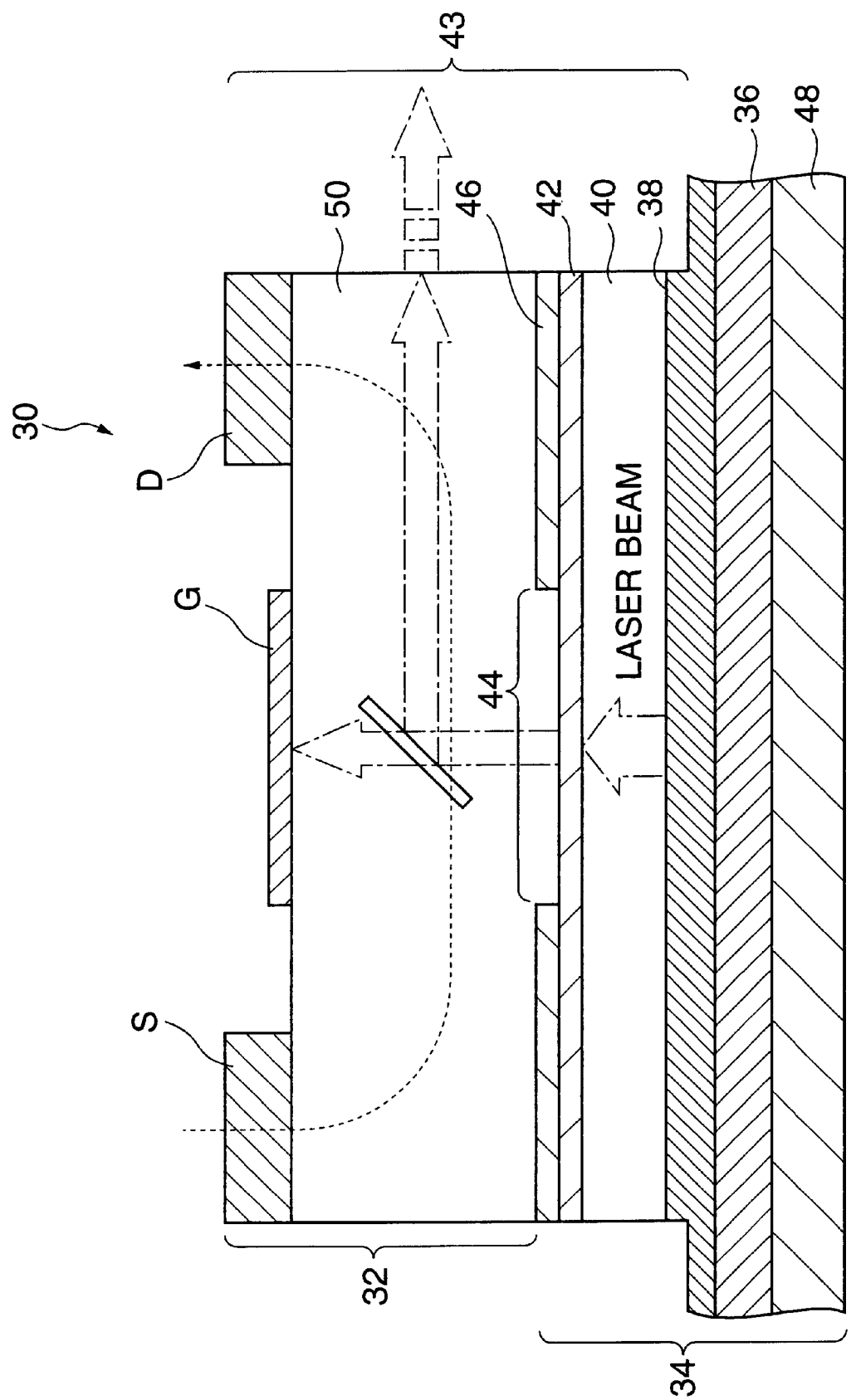
FIG. 7 is a schematic sectional view showing a path of light in the case where light of which the intensity is modulated is output from an end face in the photoelectric converter according to the invention.
Figure 8:
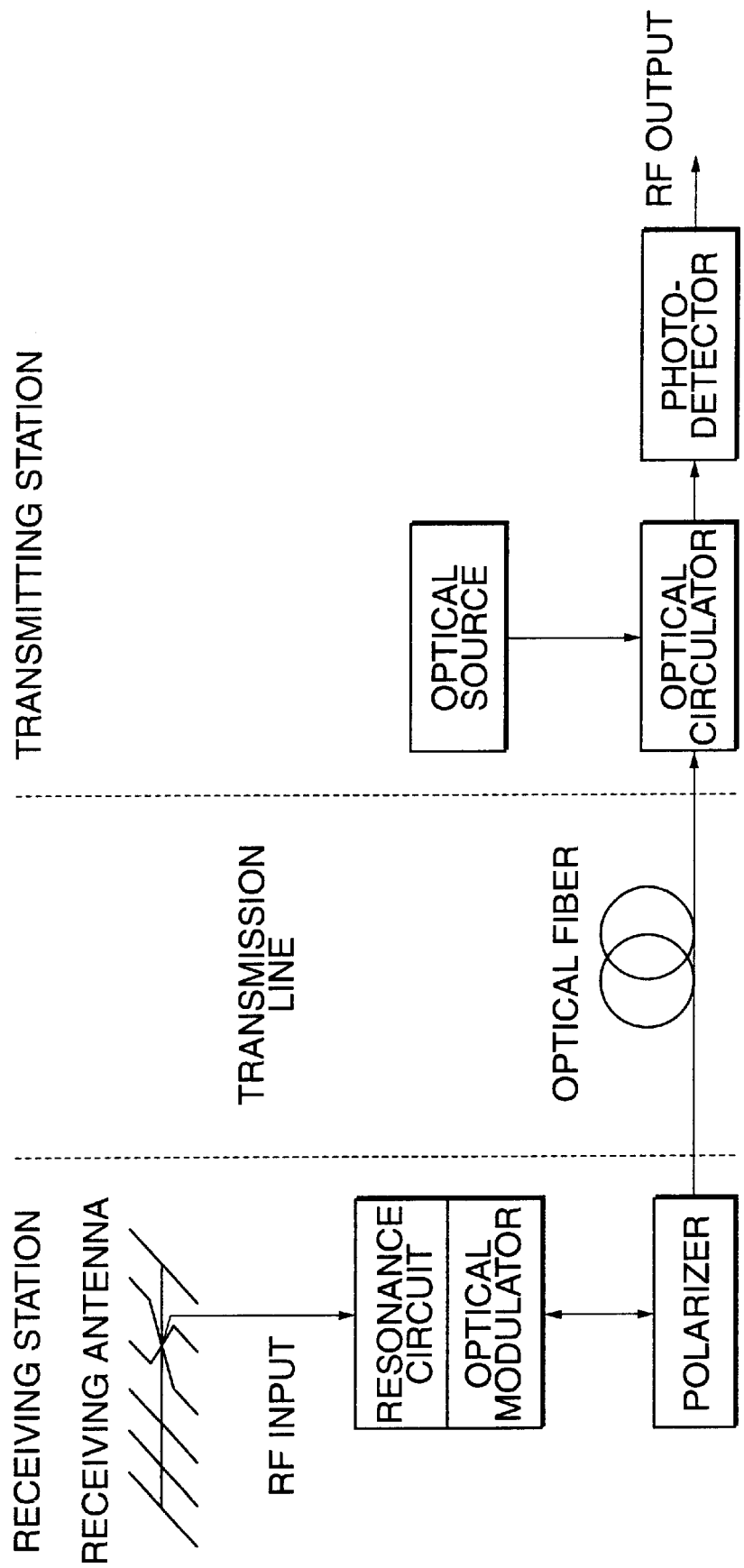
FIG. 8 is a schematic drawing showing a TV wave receiving system in a conventional type CATV.
Figure 9:
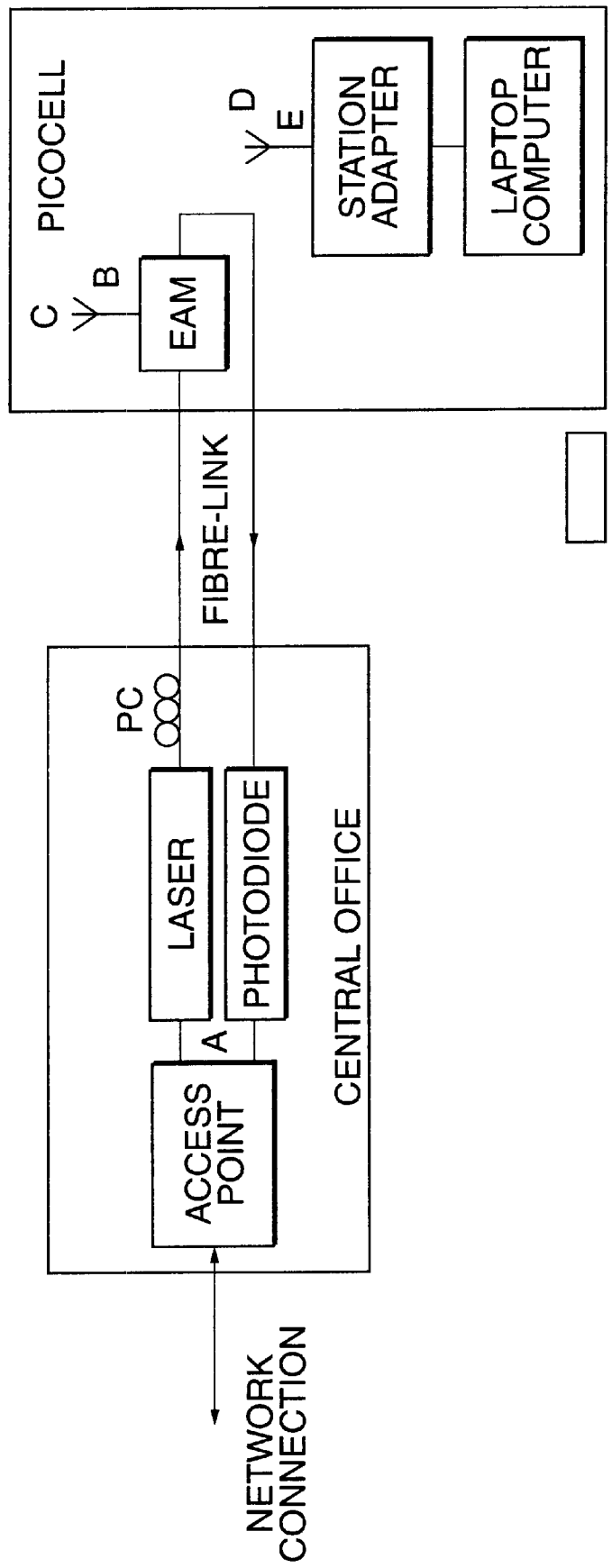
FIG. 9 is a schematic drawing showing a two-way communication system using a conventional type EAM.

In this embodiment, light is input perpendicularly to a substrate to facilitate the modulation of light, however, according to the principle described above, it is not required that light is input perpendicularly to a substrate and it is easily guessed that light can be input in parallel with a substrate or light can be made incident with a certain angle. In the case where modulated light is output utilizing the leak of light from a meander gate electrode edge, as shown in FIG. 7, a half mirror tilted by 45° for the gate electrode G is provided in the approximately center of an FET substrate, an optical waveguide for guiding light to one end face of the photoelectric converter from the half mirror is formed and a modulated light may also be made outgoing from one end face utilizing the half mirror and the optical waveguide or may also be made outgoing from both end faces. In this case, the gate electrode G is not necessarily required to transmit light.

In this embodiment, the photoelectric converter according to the invention is used in two-way communication including an uplink and a downlink, however, the photoelectric converter according to the invention is used for either of an uplink or a downlink and an element different from the photoelectric converter according to the invention may also be used for the other. For example, an uplink is performed using an element in this embodiment, and for a downlink, an element including only the existing three-terminal element such as FET is used and light in which an optical signal directly transmitted to a channel of FET via an optical fiber is superimposed can also be injected.

In this embodiment, the uplink in which a signal is input to the gate electrode is described, however, a modulating signal may also be superimposed not only on the side of the gate electrode but on the side of a laser beam by inputting a modulating signal to VCSEL and directly modulating a laser beam. At this time, as a low frequency equivalent to finite difference between them is detected on the side of a detector in the case where a signal frequency on the side of the gate electrode and a signal frequency on the side of a laser beam are differentiated, an effective signal frequency on the side of the element can be reduced.

The photoelectric converter for wireless communication according to the invention can be used as a base station that is simple and meets sufficient performance in a high frequency band and a simpler communication system can be configured at low cost by using it.

Also, the photoelectric converter for wireless communication according to the invention can be used for both an uplink and a downlink and a base station for two ways of an uplink and a downlink can be configured by one element.

What is claimed is:

1. A photoelectric converter connectable to an external antenna for wireless communication, comprising:
    a laser having a first resonation mirror and a second resonation mirror that define an active layer therebetween, and a pair of electrodes that supply energy to generate a laser beam;
    a third mirror positioned to receive the laser beam emitted from the laser;
    a channel provided between the third mirror and the laser that transmits the laser beam from the laser to the third mirror; and
    plural electrodes that supply electrical energy to the channel, one of the electrodes being connectable to the external antenna so that the photoelectric converter can serve as one of an uplink and a downlink,
    wherein when the photoelectric converter is operating as an uplink, an incoming electrical signal from the external antenna is receivable by a gate electrode of the plural electrodes, which modulates the output of the laser beam to convert the electrical signal into a corresponding optical signal, and wherein when the photoelectric converter is operating as a downlink, an optical signal from the laser beam operates on the channel and current between the plural electrodes may be provided to the external antenna to convert the optical signal into an electrical signal for transmission.

2. A photoelectric converter for wireless communication according to claim 1, wherein a depletion layer in the channel varies in thickness according to the electrical energy supplied by at least one of the plural electrodes to modulate the laser beam incident on the channel.

3. A photoelectric converter for wireless communication according to claim 2, wherein the channel generates a photocarrier in response to a signal entering thereto together with the laser beam to modulate the electrical energy supplied by the at least one of the electrodes.

4. A photoelectric converter for wireless communication according to claim 1, wherein the channel generates a photocarrier in response to a signal entering thereto together with the laser beam to modulate the electrical energy supplied by the electrodes.

5. A photoelectric convertor for wireless communication according to claim 1, further comprising plural laser electrodes that supply electrical energy to the laser.

6. A photoelectric converter for wireless communication according to claim 5, wherein the laser is directly modulated by one of the plural laser electrodes.

7. The photoelectric converter for wireless communication according to claim 1, wherein the converter operates as both a downlink and an uplink.

8. A photoelectric converter connectable to an external antenna for wireless communication, comprising:
    a laser having a first resonation mirror and a second resonation mirror that define an active layer therebetween, and a pair of electrodes that supply energy to generate a laser beam,
    a mirror electrode positioned to receive the laser beam emitted from the laser;
    a channel provided between the mirror electrode and the laser that transmits the laser beam from the laser to the mirror electrode; and
    plural electrodes that supply electrical energy to the channel, the plural electrodes including the mirror electrode, one of the electrodes being connectable to the external antenna so that the photoelectric converter can serve as one of an uplink and a downlink, wherein when the photoelectric converter is operating as an uplink, an incoming electrical signal from the external antenna is receivable by a gate electrode of the plural electrodes, which modulates the output of the laser beam to convert the electrical signal into a corresponding optical signal, and wherein when the photoelectric converter is operating as a downlink, an optical signal from the laser beam operates on the channel and current between the plural electrodes may be provided to the external antenna to convert the optical signal into an electrical signal for transmission.

9. A photoelectric converter for wireless communication according to claim 8, wherein a depletion layer in the channel varies in thickness according to the electrical energy supplied by the mirror electrode to modulate the laser beam incident on the channel.

10. A photoelectric converter for wireless communication according to claim 9, wherein the channel generates a photocarrier in response to a signal entering thereto together with the laser beam to modulate the electrical energy supplied by the mirror electrode .

11. A photoelectric converter for wireless communication according to claim 8, wherein the channel generates a photocarrier in response to a signal entering thereto together with the laser beam to modulate the electrical energy supplied by the mirror electrode.

12. A photoelectric converter for wireless communication according to claim 8, further comprising plural laser electrodes that supply electrical energy to the laser.

13. A photoelectric converter for wireless communication according to claim 12, wherein the laser is directly modulated by one of the plural laser electrodes.

14. The photoelectric converter for wireless communication according to claim 8, wherein the converter operates as both a downlink and an uplink.

15. A photoelectric converter connectable to an external antenna for wireless communication, comprising:
a vertical cavity surface emitting laser having a first mirror and a second mirror that define an active layer therebetween, and a pair of electrodes that supply energy to generate a laser beam;
a mirror electrode constituting a cavity that is provided within a vertical cavity of the vertical cavity surface emitting laser;
a channel provided between the mirror electrode and the vertical cavity surface emitting laser that transmits the laser beam from the laser to the mirror electrode; and
plural electrodes that supply electrical energy to the channel, the plural electrodes including the mirror electrode, one of the electrodes being connectable to the external antenna so that the photoelectric converter can serve as one of an uplink and a downlink,
wherein when the photoelectric converter is operating as an uplink, an incoming electrical signal from the external antenna is receivable by a gate electrode of the plural electrodes, which modulates the output of the laser beam to convert the electrical signal into a corresponding optical signal, and wherein when the photoelectric converter is operating as a downlink, an optical signal from the laser beam operates on the channel and current between the plural electrodes may be provided to the external antenna to convert the optical signal into an electrical signal for transmission.

16. A photoelectric converter for wireless communication according to claim 15, further comprising plural laser electrodes that supply electrical energy to the laser.

17. A photoelectric converter for wireless communication according to claim 16, wherein the laser is directly modulated by one of the plural laser electrodes.

18. The photoelectric converter for wireless communication according to claim 15, wherein the converter operates as both a downlink and an uplink.

19. A photoelectric converter for wireless communication, comprising:
a laser having a first resonation mirror and a second resonation mirror that define an active layer therebetween, and a pair of electrodes that supply energy to generate a laser beam;
a MESFET formed on the laser, said MESFET including a channel positioned between a source electrode and a drain electrode, and a gate electrode positioned between the source and drain electrodes, the gate electrode being positioned to receive the laser beam emitted from the laser through the channel, wherein the source, drain and gate electrodes supply electrical energy to the channel.

20. The photoelectric converter for wireless communication according to claim 19, wherein at least one of the gate and drain electrodes are operably connectable to an external antenna so that the photoelectric converter can serve as one of an uplink and a downlink,
wherein when the photoelectric converter is operating as an uplink, an incoming electrical signal from the external antenna is receivable by the gate electrode, which modulates the output of the laser beam to convert the electrical signal into a corresponding optical signal, and wherein when the photoelectric converter is operating as a downlink, an optical signal from the laser beam operates on the channel and current flowing through the drain electrode may be provided to the external antenna to convert the optical signal into an electrical signal for transmission.

21. The photoelectric converter for wireless communication according to claim 20, wherein the converter operates as both a downlink and an uplink.

* * * * *